(12) United States Patent
Kim et al.

(10) Patent No.: US 7,453,959 B2
(45) Date of Patent: Nov. 18, 2008

(54) APPARATUS AND METHOD FOR ERASURE DETECTION AND SOFT-DECISION DECODING IN CELLULAR SYSTEM RECEIVER

(75) Inventors: Yun-Hee Kim, Daejeon (KR);
Kwang-Soon Kim, Daejeon (KR);
Sang-Hyun Lee, Daejeon (KR);
Jae-Young Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 738 days.

(21) Appl. No.: 11/000,290

(22) Filed: Nov. 29, 2004

(65) Prior Publication Data

US 2005/0278609 A1 Dec. 15, 2005

(30) Foreign Application Priority Data

Jun. 9, 2004 (KR) .................. 10-2004-0042143

(51) Int. Cl.
*H03K 9/00* (2006.01)
*H04L 27/00* (2006.01)
*H03M 13/00* (2006.01)

(52) U.S. Cl. ............... 375/340; 375/316; 714/780
(58) Field of Classification Search ........... 375/340, 375/316; 714/780, 752, 746, 699
See application file for complete search history.

(56) References Cited

U.S. PATENT DOCUMENTS

| 4,928,288 A | 5/1990 | D'Aria et al. |
| 5,636,253 A | 6/1997 | Spruyt |
| 5,942,003 A | 8/1999 | Ivry |
| 6,473,418 B1 | 10/2002 | Laroia et al. |
| 7,075,905 B2 * | 7/2006 | Chen et al. .............. 370/318 |
| 2003/0128744 A1 * | 7/2003 | Yeo et al. .............. 375/147 |
| 2004/0136349 A1 * | 7/2004 | Walton et al. ........... 370/338 |
| 2006/0114981 A1 * | 6/2006 | Ghosh et al. ............ 375/232 |
| 2006/0184839 A1 * | 8/2006 | Golitschek Edler Von Elbwart et al. ..................... 714/48 |

OTHER PUBLICATIONS

IEEE Transactions on Communications, vol. 40, No. 7, Jul. 1992, pp. 1231-1238.
IEEE Transactions on Communications, vol. 47, No. 11, Nov. 1999, pp. 1646-1654.
IEEE Transactions on Communications, vol. 50, No. 2, Feb. 2002, pp. 321-331.

* cited by examiner

*Primary Examiner*—David C Payne
*Assistant Examiner*—Brian J Stevens
(74) *Attorney, Agent, or Firm*—Blakely, Sokoloff, Taylor & Zafman LLP

(57) ABSTRACT

Disclosed is an apparatus and method for erasure detection and soft-decision decoding in a cellular system receiver. In the present invention, a complex channel gain and a noise variance of a received symbol from a cellular system transmitter are estimated, and an erasure symbol (a symbol with high power interference) is detected by comparing a threshold value according to the estimated complex channel gain or noise variance with power of the received symbol. Log-likelihood ratios corresponding to constituent bits of the detected erasure symbols are allowed to be 0, and the log-likelihood ratios of the constituent bits of the other received symbols are calculated. A soft-decision decoding operation of received bits is performed with the calculated log-likelihood ratios.

16 Claims, 5 Drawing Sheets

APPARATUS AND METHOD FOR ERASURE DETECTION AND SOFT-DECISION DECODING IN CELLULAR SYSTEM RECEIVER

CROSS REFERENCE TO RELATED APPLICATION

This application claims priority to and the benefit of Korea Patent Application No. 10-2004-42143 filed on Jun. 9, 2004 in the Korean Intellectual Property Office, the entire content of which is incorporated herein by reference.

BACKGROUND OF THE INVENTION (a) Field of the Invention

The present invention relates to a cellular wireless communication system of an orthogonal frequency division multiple access (OFDMA) method. More specifically, the present invention relates to an apparatus and method for erasure detection and soft-decision decoding in a cellular system receiver.

(b) Description of the Related Art

Conventionally, an orthogonal frequency division multiple access (OFDMA) cellular system, to make cell planning easy, uses a method of averaging inter-cell interference which assigns different frequency hopping patterns to different cells and allows a physical channel of a cell to be evenly collided with the physical channels of other cells.

The method of averaging inter-cell interference is disclosed in U.S. Pat. No. 6,473,418 which allows a frequency reuse factor to be near 1 without a complicated cell planning through frequency hopping. However, it is still necessary to consider a user at a cell boundary where the inter-cell interference is dominant to achieve the frequency reuse factor of one.

In the downlink, base station transmission signals of neighboring cells cause interference to the user, and frequency hopping patterns among neighboring cells are different and the transmission power of data channels is differently assigned to users according to locations of the users and their channel status, and therefore, the interference signal pattern are varied each time.

Accordingly, the interference becomes highly non-uniform when a portion of physical channels are active in the neighboring cells or the transmission power of a specific physical channel is higher than that of the other physical channels. That is, a portion of the received symbols suffer from high interference and the interference power and the location of the interfered symbols are unknown.

Error correcting codes are used in order to recover information reliably in partially interfered cases.

Most methods for combating the partial intensive interference with the error correcting codes use Reed-Solomon codes with erasures and errors decoding. Especially, the Reed-Solomon codes are used with an orthogonal signal waveform set in a frequency hopping spread system.

In the methods, an erasure symbol is detected by using the ratio of the outputs of envelope detectors matched to each symbol point of an orthogonal signal waveform set, or by deriving a complicated detecting equation which reduces the decoding error probability of Reed-Solomon codes under the assumption that the interference power is known.

Accordingly, the conventional erasure detection methods are difficult to apply to the systems with other modulation schemes such as M-PSK (M-ary phase shift keying) and other multiple access schemes, or the interference power that the received symbol undergoes is unknown and varied.

Turbo codes and low-density parity checking codes using soft-decision decoding metrics and iterative decoding have drawn a lot of attentions because those codes are designed to provide a better performance than other codes including the Reed-Solomon codes.

For soft-decision decoding of turbo codes and the low-density parity checking codes, the log-likelihood ratios of codeword bits are calculated as the decoding metric inputs, and it is necessary to know the variance of noise added to the received symbol in order to calculate the optimal decoding metric.

However, it is hard to estimate the variance of the noise which each received symbol undergoes in the downlink with fast frequency hopping where the inter-cell interference power in each received symbol is different and unknown. Thus, a receiver conventionally estimates an average value of the noise variance comprising the interference that the received symbols undergo.

When the decoding metric is calculated by using the averaging value of the noise variance comprising the interference even if some of the received symbols are interfered by the strong interference, interfered symbols which are actually less reliable erroneously provide decoding metrics with high reliability, and therefore a channel decoder makes an erroneous decision when performing the iterative decoding operation.

SUMMARY OF THE INVENTION

It is an advantage of the present invention to provide an apparatus and method for an erasure detection and soft-decision decoding in a cellular system receiver finding the received symbol (an erasure symbol) which is determined to have high power interference and reducing the symbol's effects on a channel decoding in order to improve a system performance in circumstances where the power of interference which a received symbol undergoes is varied.

It is another advantage of the present invention to provide an apparatus and method for the erasure detection and soft-decision decoding in a cellular system receiver re-estimating a noise variance and detecting the erasure symbols again when the erasure symbols are once detected, or using the erasure symbols when soft-decision decoding metrics are calculated in order to combat the partially interfered cases.

In one aspect of the present invention, an erasure detection and soft-decision decoder in a cellular system receiver for decoding a code block from a cellular system transmitter comprises a channel gain and noise variance estimator for estimating complex channel gains and a noise variance of the received code block; an erasure detector for detecting an erasure symbol (a received data symbol with high power interference) by comparing a threshold value based on the estimated complex channel gain or the noise variance with power of the received symbol; a soft-decision decoding metric calculator for establishing log-likelihood ratios of constituent bits of the erasure symbols to be 0 and computing the log-likelihood ratios of the constituent bits of the other received symbols; and a soft-decision channel decoder for decoding the received code block with the calculated log-likelihood ratios.

The erasure detection and soft-decision decoder in a cellular system receiver further comprises a noise variance re-estimate unit for re-estimating the noise variance by using the other received symbols which are not detected as the erasure symbol.

In another aspect of the present invention, a method for erasure detection and soft-decision decoding in a cellular system receiver for decoding a received data block from a cellular system transmitter comprises a) estimating complex channel gains and a noise variance of the received data block; b) detecting an erasure symbol (a received data block with high power interference) by comparing the power of the received symbol with a first threshold value based on the estimated complex channel gain or the noise variance; c) establishing log-likelihood ratios of constituent bits of the detected erasure symbols to be 0 and computing the log-likelihood ratios of the constituent bits of the other received symbols; and d) decoding the received data block with the calculated log-likelihood ratios.

The method further comprises e) re-estimating the noise variance by using the other symbols which are not detected as the erasure symbol.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
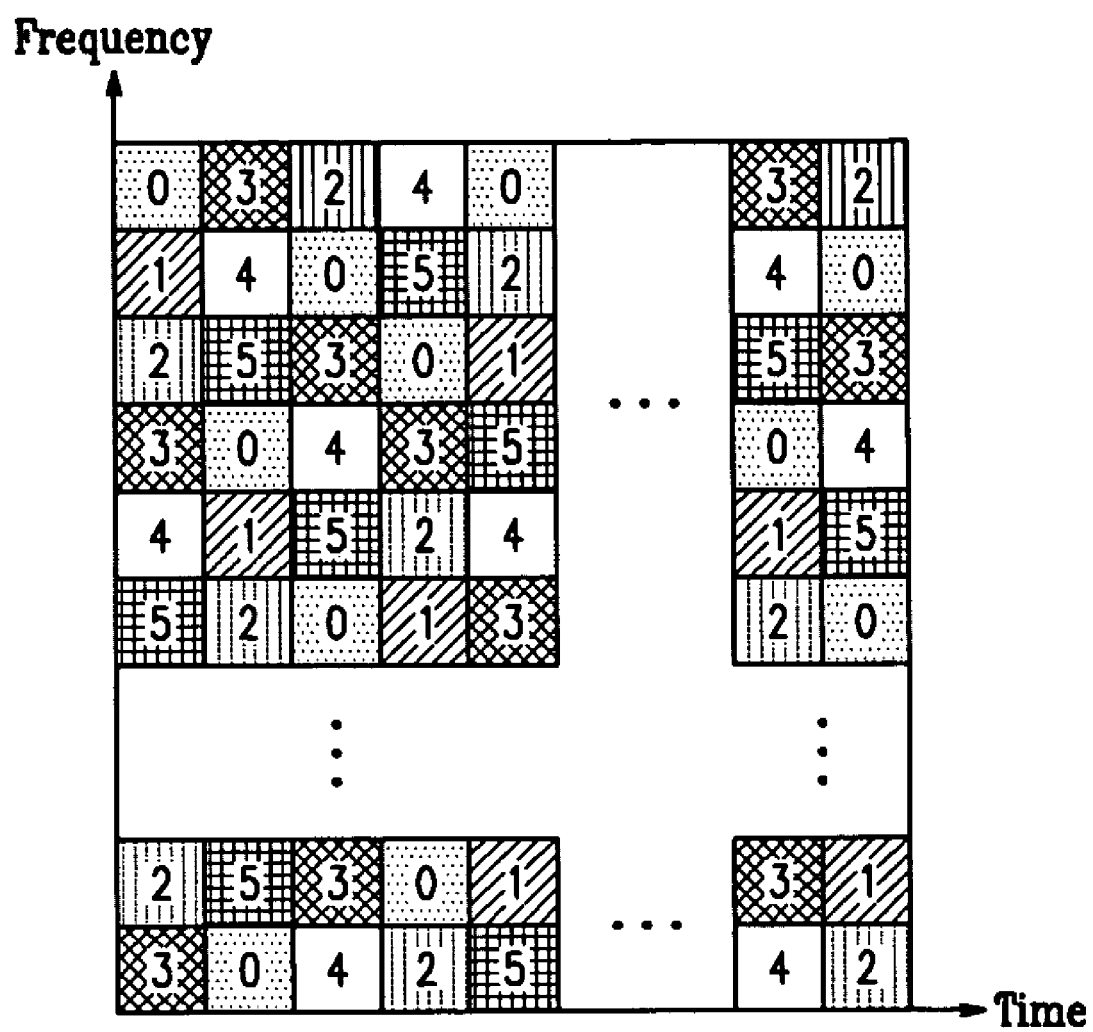
FIG. 1 shows a diagram for representing a channel configuration for each downlink of an orthogonal frequency division multiple access method according to an exemplary embodiment of the present invention.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

FIG. 1 shows a diagram for representing a channel configuration for each downlink of an orthogonal frequency division multiple access method according to an exemplary embodiment of the present invention.

As shown in FIG. 1, a slot includes a plurality of orthogonal frequency division multiplexing (henceforth referred to as OFDM) symbols and six physical channels based on frequency hopping.

Conventionally, a slot includes more than six physical channels, and different frequency hopping methods are applied to the physical channels of neighboring cells for the purpose of averaging interference. A physical channel in the slot may become a pilot channel or a data channel. Instead of providing the physical channel, an independent preamble can be provided in the slot so as to estimate channels.

Figure 2:
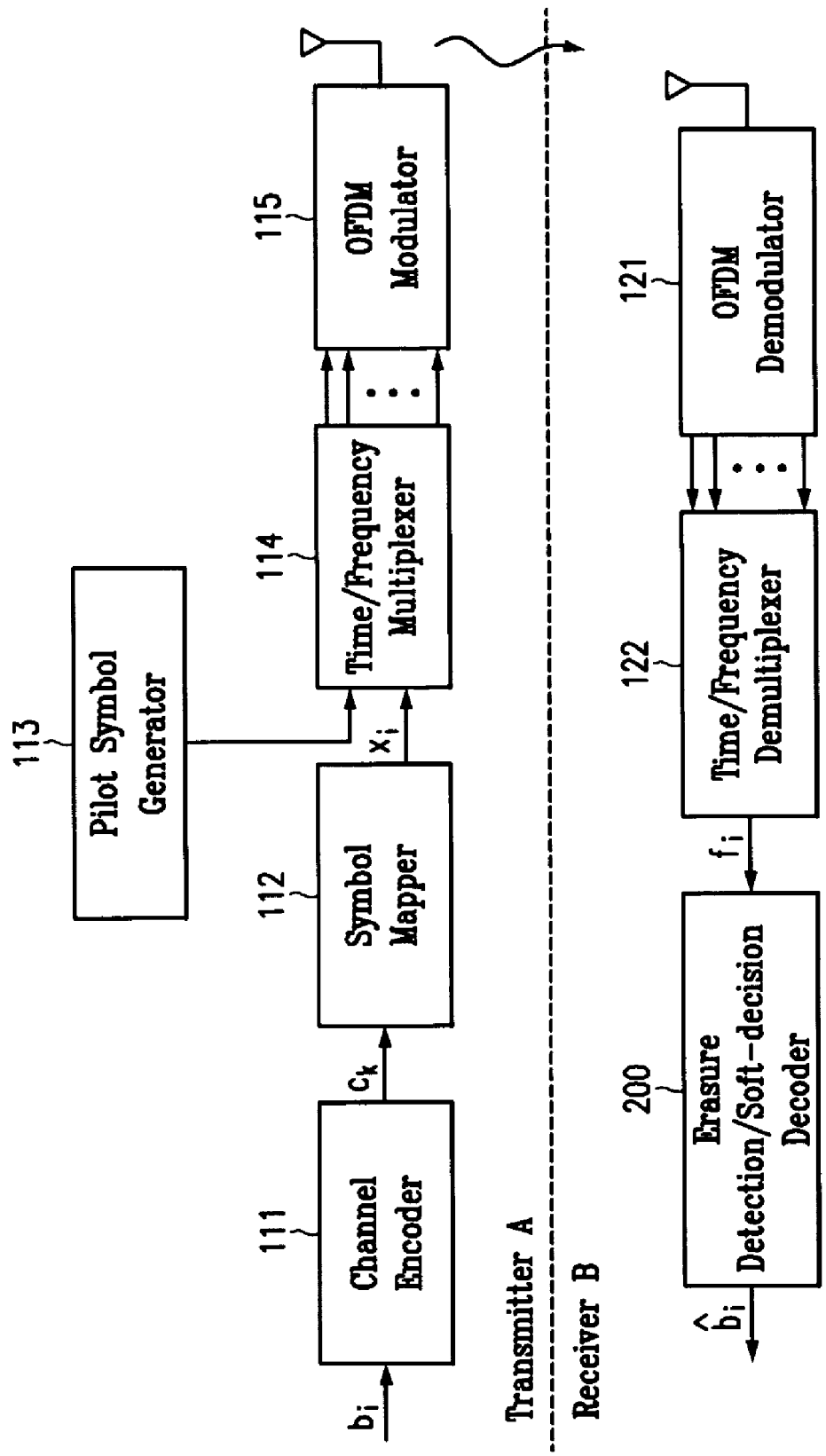
FIG. 2 shows a block diagram for representing a schematic configuration of a cellular system according to an exemplary embodiment of the present invention.

FIG. 2 shows a block diagram for representing a schematic configuration of a cellular system according to an exemplary embodiment of the present invention.

As shown in FIG. 2, the cellular system comprises a transmitter A for transmitting OFDM signals, and a receiver B.

The transmitter A comprises a channel encoder 111, a symbol mapper 112, a pilot symbol generator 113, a time/frequency multiplexer 114, and an OFDM modulator 115. The receiver B comprises an OFDM demodulator 121, a time/frequency demultiplexer 122, and an erasure detection/soft-decision decoder 200.

The channel encoder 111 encodes an information data block $\{b_i, i=0, 1, \ldots, K-1\}$ to be transmitted to a physical channel, and the symbol mapper 112 maps the encoded information data block into an M-PSK symbol or a QAM symbol.

Data symbols to be transmitted to each physical channel and the pilot symbols generated by a pilot symbol generator 113 are mapped into time/frequency resources of the physical channel of the slot by the time/frequency multiplexer 114, and the OFDM modulator 115 modulates the multiplexer output to OFDM signals and transmits them to the receiver B.

The OFDM demodulator 121 of the receiver B converts the received OFDM signals to frequency domain symbols, and the time/frequency demultiplexer 122 extracts pilot symbols and received data symbols of the corresponding physical channel to be demodulated. And the erasure detection/soft-decision decoder 200 according to the exemplary embodiment of the present invention decodes the transmitted information bits based on the received data symbols and channel gain estimates.

At this time, the received symbols from a physical channel are represented as in the following.

$$r_l = h_l x_l + w_l, \, l=0, 1, \ldots, L-1 \quad \text{[Equation 1]}$$

where $r_l$, $h_l$, $w_l$ denote the $l^{th}$ received symbol, the $l^{th}$ channel gain, the $l^{th}$ transmit symbol, and the $l^{th}$ additive noise of each code block which are represented as complex values. L denotes a length of the received symbols corresponding to a code block.

At this time, the transmitted symbol is represented by $E\{|x_l|^2\}=1$, and a complex channel gain $h_l$ which is a complex channel response comprising transmission power is estimated by the pilot channel with the transmission power which is greater than the transmission power of a data channel.

The additive noise $w_l$ is represented by a sum of a white background noise $n_l$ and inter-cell interference noise $I_l$ and variance of $n_l$ and $I_l$ are respectively represented by $\sigma^2_n$ and $\sigma^2_{I,l}$ At this time, the variance of the white background noise is equal regardless of the received symbol's location, however, the variance of inter-cell interference noise will be varied for each received symbol according to frequency hopping patterns of the cells, power assignment of the data channel of neighboring cells, and locations of the receiver. Therefore, the interference noise variance of each received symbol $\sigma^2_{w,l} = \sigma^2_n + \sigma^2_{I,l}$ cannot be estimated.

Instead, an average of the additive noise variance $$\sigma^2_{w,a} = \sigma^2_n + \frac{1}{L}\sum_{l=0}^{L-1} \sigma'^2_{I_l}$$

is estimated by using the pilot channel or the desired data channel itself because the physical channels have the same level of interference in average because of the interference averaging by the interference hopping.

The variance of the white background noise $\sigma^2_n$ is estimated by the receiver by using a null subcarrier of the OFDM cellular system if it is required.

An erasure detection and soft-decision decoder in the cellular system receiver according to the exemplary embodiment of the present invention will be described.

Figure 3:
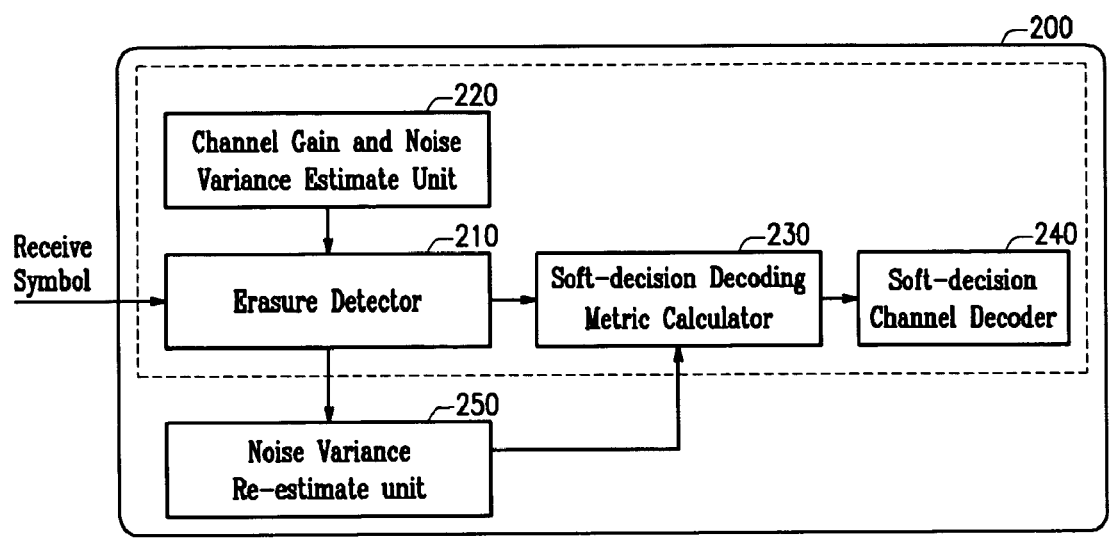
FIG. 3 shows a block diagram for representing an internal configuration of an erasure detection and soft-decision decoder in the cellular system receiver as shown in FIG. 2.

FIG. 3 shows a block diagram for representing an internal configuration of an erasure detection and soft-decision decoder in the cellular system receiver shown in FIG. 2.

As shown in FIG. 3, the erasure detection and soft-decision decoder 200 comprises an erasure detector 210, a channel gain and noise variance estimator 220, a soft-decision decoding metric calculator 230, a soft-decision channel decoder 240, and a noise variance re-estimate unit 250.

In the following exemplary embodiments of the present invention, a first exemplary embodiment comprising the erasure detector 210 and the soft-decision channel decoder 240, and a second exemplary embodiment comprising the erasure detector 210 and the noise variance re-estimate unit 250, will be respectively described for ease of description.

The erasure detection and soft/decision decoder 200 according to the first exemplary embodiment will now be described.

The erasure detector 210 detects an erasure symbol index of which the received symbol power is greater than a threshold value $T_l$ by comparing the received symbol power $|r_l|^2$ for each symbol in the code block with the threshold value $T_l$.

At this time, the erasure detector 210 uses a constant multiple of power of complex channel gain of the received symbol such as $T_l = C_l |\hat{h}_l|^2$, or a sum of the power of complex channel gain of the received symbol and a constant multiple of the average noise variance such as $T_l = |\hat{h}_l|^2 + C_2 \sigma^2_{w,a}$ for the threshold value $T_l$.

At this time, the $C_1$ (or $C_2$ if the second threshold value is chosen for the threshold value $T_l$) is a value such that the system performance is not decreased when the interference noises have uniform power or there is no interference noise, and the values that are effectively detected when there is high power interference noise in a portion of the received symbols, and therefore the constant $C_1$ and the constant $C_2$ are selected by a simulated experiment or a field test.

The channel gain and noise variance estimator 220 estimates a complex channel gain $h_l$ of the received symbol and a noise variance $\sigma^2_{w,l}$, and provides them to the erasure detector 210. The complex channel gain $h_1$ is estimated by using the pilot channel.

The noise variance $\sigma^2_{w,l}$ of each received symbol is difficult to estimate, and therefore the channel gain and noise variance estimator 220 calculates an average noise variance $\sigma^2_{w,a}$ as an estimate of a noise variance $\sigma^2_{w,l}$. The average noise variance $\sigma^2_{w,a}$ is calculated by using the pilot channel as the following.

$$\sigma^2_{w,a} = \frac{1}{L_p} \sum_{p \in \text{PILOT}} |r_p - \hat{h}_p x_p|^2 \quad \text{[Equation 2]}$$

where $r_p$ denotes a pilot receive symbol, $x_p$ is a pilot transmit symbol, $\hat{h}_p$ is a complex channel fading gain which is estimated with a pilot channel through filtering or interpolating the tentative pilot channel estimates, PILOT is a pilot index set which is used for estimation, and $L_p$ is the number of pilot symbols which are used for estimation.

The noise variance $\sigma^2_{w,a}$ is estimated with the desired data channel by detecting a transmit symbol from a received symbol as given in [Equation 3] when the noise variance $\sigma^2_{w,a}$ is not estimated by using the pilot channel.

$$\sigma^2_{w,a} = \frac{1}{L} \sum_{l=0}^{L-1} |r_l - \hat{h}_l \hat{x}_l|^2 \quad \text{[Equation 3]}$$

in which $\hat{h}_l$ is a channel estimate of an $l^{th}$ data position of the received data channel estimated by the pilot channel, and $\hat{x}_l$ is an estimate of the transmission symbol which is estimated from $r_l / \hat{h}_l$.

When the soft-decision decoding metric calculator 230 calculates log-likelihood ratios of transmission bits from the received symbol, the calculator 230 establishes the log-likelihood ratios of constituent bits of the erasure symbols detected by the erasure detector 210 to be 0, but calculates the log-likelihood ratios of the constituent bits of the symbol which is not detected as the erasure symbol.

At this time, the soft-decision decoding metric calculator 230 uses the average noise variance a $\sigma^2_{w,a}$ estimated by the channel gain and noise variance estimator 220 as the noise variance of the received symbols in computing the log-likelihood ratios regardless of whether the threshold value used by the erasure detector 210 is $T_l = C_l |\hat{h}_l|^2$ or $T_l = |\hat{h}_l|^2 + C_2 \sigma^2_{w,a}$.

The soft-decision channel decoder 240 performs soft-decision channel decoding with the log-likelihood ratios calculated by the soft-decision decoding metric calculator 230, corresponding to an encoding method used by the transmitter (illustrated as A in FIG. 2). That is, the soft-decision channel decoding is performed according to which codes (turbo codes or LDPC codes) are used by the transmitter A for performing the channel coding.

An erasure detection and soft-decision decoder 200 according to a second exemplary embodiment of the present invention will be described.

An erasure detector 210 detects an erasure symbol index of which received symbol power is greater than a threshold value by comparing the received symbol power $|r_l|^2$ of the $l^{th}$ symbol in a code block with the threshold value $T_l$.

At this time, the erasure detector 210 uses a constant multiple of power of complex channel gain of the received symbol $T_l = C_l |\hat{h}_l|^2$, or a sum of the power of complex channel gain of the received symbol and a constant multiple of the average noise variance $T_l = |\hat{h}_l|^2 + C_2 \sigma^2_{w,a}$ as a threshold value.

The $C_1$ and $C_2$ are values such that the system performance is not decreased when the interference power is uniform over the received symbols or there is no interference noise, and the values such that high power interfered symbols are effectively detected when there is partially high power interference noise, and therefore the constant $C_1$ or the constant $C_2$ is selected by a simulated experiment or a field test.

The channel gain and noise variance estimator 220 estimates a complex channel gain $h_l$ and a noise variance $\sigma^2_{w,l}$ of the received symbol, and provides them to the erasure detector 210. The estimation method follows the manner of the above-described first exemplary embodiment.

A method for re-estimating the noise variance $\sigma^2_{w,l}$ by the noise variance re-estimate unit is to estimate $\sigma^2_{w,l}$ by using the received symbols which are not determined to be the erasure symbols in the like manner of the following [Equation 4].

$$\sigma_{w,u}^2 = \frac{1}{|U|} \sum_{l \in U} \left( |r_l|^2 - |\hat{h}_l|^2 \right) \quad \text{[Equation 4]}$$

where U denotes an index set of the received symbols which are not detected as an erasure symbol by the erasure detector 210, and |U| denotes a number of elements of the set of U. Status of whether to estimate the noise variance $\sigma_{w,u}^2$ is determined according to the noise variance estimation performance of [Equation 4] as to corresponding system parameters.

Another method for re-estimating the noise variance $\sigma_{w,u}^2$ by the noise variance re-estimate unit 250 is to use the received symbols which are not determined to be the erasure symbols, and an estimate of the transmit symbol before the channel decoding operation as given in [Equation 5].

$$\sigma_{w,u}^2 = \frac{1}{|U|} \sum_{l=u} |r_l - \hat{h}_l \hat{x}_l|^2 \quad \text{[Equation 5]}$$

The erasure detector 210 detects the erasure symbol by using a new threshold value according to the re-estimated noise variance $\sigma_{w,u}^2$. At this time, the new threshold value $T_l = |\hat{h}_l|^2 + C_3 \sigma_{w,u}^2$ is represented by a sum of the complex channel gain power of the received symbol and the constant multiple of the re-estimated noise variance.

At this time, the constant $C_3$ is usually greater than or equal to $C_2$, and $C_3$ is a value such that the system performance is not decreased when the power of interference noises are uniform in the received symbols or there is no interference noise, and a value such that high power interfered symbols are effectively detected when a portion of the received symbols suffers high power interference noise, and therefore the constant $C_3$ is selected by a simulated experiment or a field test.

The soft-decision decoding metric calculator 230 calculates a decoding metric by using the information on the erasure symbol finally detected by the erasure detector 210 and the noise variance $\sigma_{w,u}^2$ estimated by the noise variance re-estimate unit 250.

That is, when the soft-decision decoding metric calculator 230 calculates log-likelihood ratios of transmission bits from the received symbol, the calculator 230 establishes the log-likelihood ratios of constituent bits of the erasure symbols detected by the erasure detector 210 to be 0, but calculates the log-likelihood ratios as to the constituent bits of the symbols which are not detected as the erasure symbol.

At this time, the soft-decision decoding metric calculator 230 uses the noise variance $\sigma_{w,u}^2$ estimated by the erasure detector 210 as the noise variance in calculating the log-likelihood ratios.

The soft-decision channel decoder 240 performs soft-decision channel decoding with the log-likelihood ratios calculated by the soft-decision decoding metric calculator 230, according to an encoding method used by the transmitter (not illustrated).

An operation. process by the erasure detection and soft-decision decoder 200 according to the second exemplary embodiment forming the above described configuration will be described.

Figure 4:
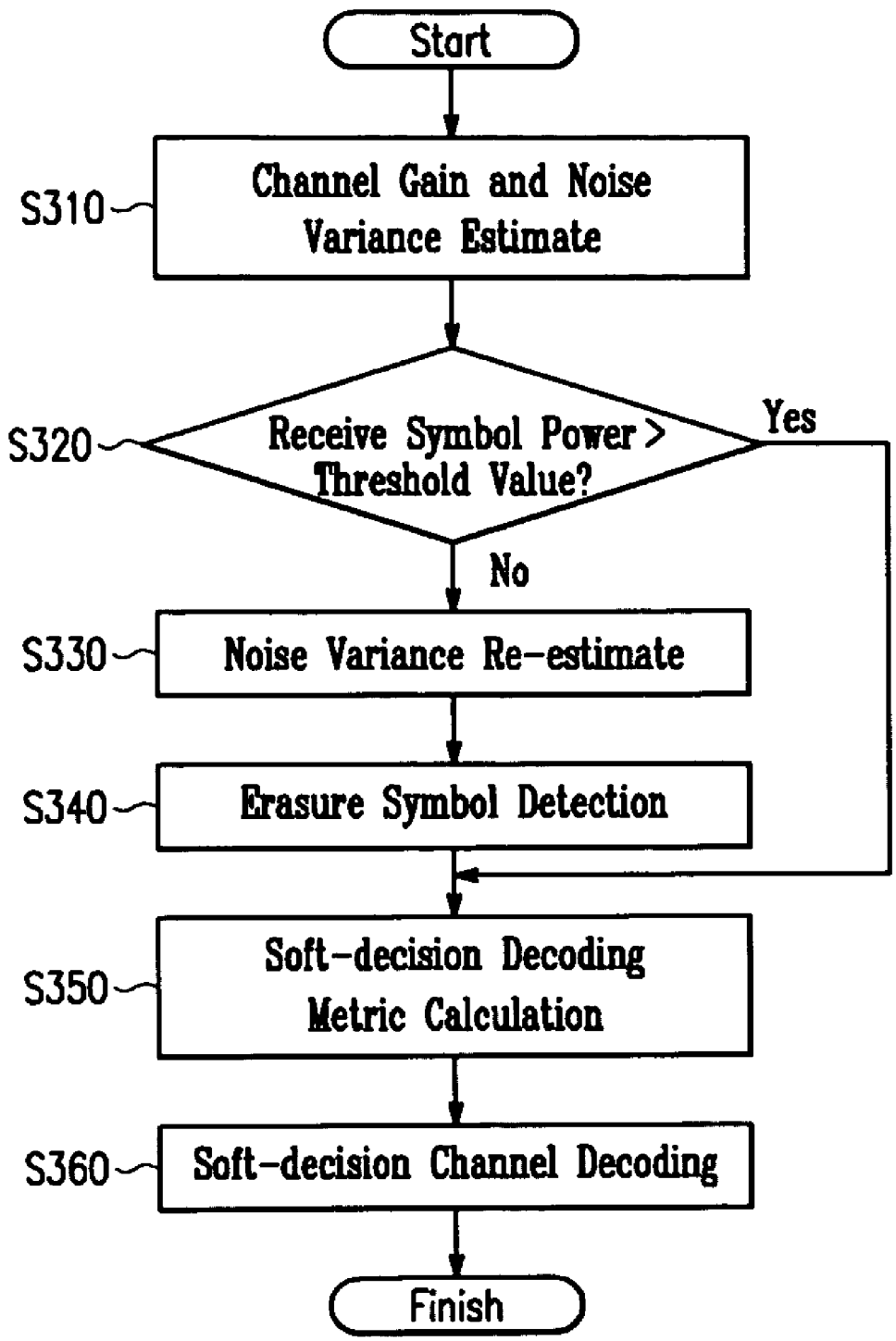
FIG. 4 shows a flow chart for representing a sequential operation of an erasure detection and soft-decision decoder as shown in FIG. 3.

FIG. 4 shows a flow chart for representing a sequential operation of an erasure detection and soft-decision decoder shown in FIG. 3.

As shown in FIG. 4, the channel gain and noise variance estimator 220 estimates a complex channel gain $h_l$ and a noise variance $\sigma_{w,l}^2$ of the received symbol (S310). At this time, the complex channel gain $h_l$ is estimated by using the pilot channel properly arranged in the time and frequency domains.

The noise variance $\sigma_{w,l}^2$ of the $l^{th}$ received symbol is difficult to estimate for each symbol, and therefore, the noise variance $\sigma_{w,l}^2$ is estimated by calculating the average noise variance $a\sigma_{w,a}^2$ in the physical data channel. The average noise variance $r\sigma_{w,a}^2$ is given by the above described [Equation 2].

The erasure detector 210 compares the threshold value according to the complex channel gain or complex channel gain and (average) noise variance estimated by the channel gain and noise variance estimator 220 with the received symbol power $|r_l|^2$ in the code block (S320).

That is, the erasure detector 210 detects an erasure symbol index of which received symbol power is greater than the threshold value by comparing the received symbol power $|r_l|^2$ with the threshold value $T_l$.

At this time, the erasure detector 210 uses a constant multiple of power of complex channel gain of the received symbol such as $T_l = C_l |\hat{h}_l|^2$, or a sum of the power of complex channel gain of the received symbol and a constant multiple of the average noise variance such as $T_l = |\hat{h}_l|^2 + C_2 \sigma_{w,a}^2$ for the threshold value $T_l$.

The $C_1$ and $C_2$ are values such that the system performance is not decreased when the power of interference noises are uniform in the received symbols or there is no interference noise, and values such that high power interfered symbols are effectively detected when a portion of the received symbols suffers high power interference noise, and therefore the constant $C_1$ and the constant $C_2$ are selected by a simulated experiment or a field test.

The noise variance re-estimate unit 250 uses the received symbols which are not determined to be the erasure symbols and re-estimates the noise variance $\sigma_{w,u}^2$ [Equation 4] or [Equation 5] (S330).

The erasure detector 210 detects the erasure symbol by using a new threshold value according to the noise variance a $\sigma_{w,u}^2$ re-estimated by the noise variance re-estimate unit 250 (S340). At this time, the new threshold value $T_l = |\hat{h}_l|^2 + C_3 \sigma_{w,u}^2$ is represented by the sum of the power of complex channel gain and the constant multiple of the noise variance.

The constant $C_3$ is usually greater than or equal to $C_2$, and $C_3$ is a value such that the system performance is not decreased when the power of interference noises are uniform in the received symbols or there is no interference noise, and a value such that high power interfered symbols are effectively detected when a portion of the received symbols suffers high power interference noise, and therefore the constant $C_3$ is selected by a simulated experiment or a field test.

The soft-decision decoding metric calculator 230 calculates a decoding metric by using information on the erasure symbol finally detected by the erasure detector 210 and the noise variance $\sigma_{w,u}^2$ estimated by the noise variance re-estimate unit 250 (S350).

That is, when the soft-decision decoding metric calculator 230 calculates log-likelihood ratios of transmission bits from the received symbol, the calculator 230 establishes the log-likelihood ratios of constituent bits of the erasure symbols detected by the erasure detector 210 to be 0, but calculates the log-likelihood ratios of the constituent bits of the symbols which are not detected as the erasure symbol.

At this time, the soft-decision decoding metric calculator 230 uses the noise variance $\sigma_{w,u}^2$ estimated by the erasure detector 210 as the noise variance in calculating the log-likelihood ratios.

The soft-decision channel decoder 240 performs soft-decision channel decoding with the log-likelihood ratios calculated by the soft-decision decoding metric calculator 230, according to a coding method used by the transmitter (not illustrated). (S360).

Figure 5:
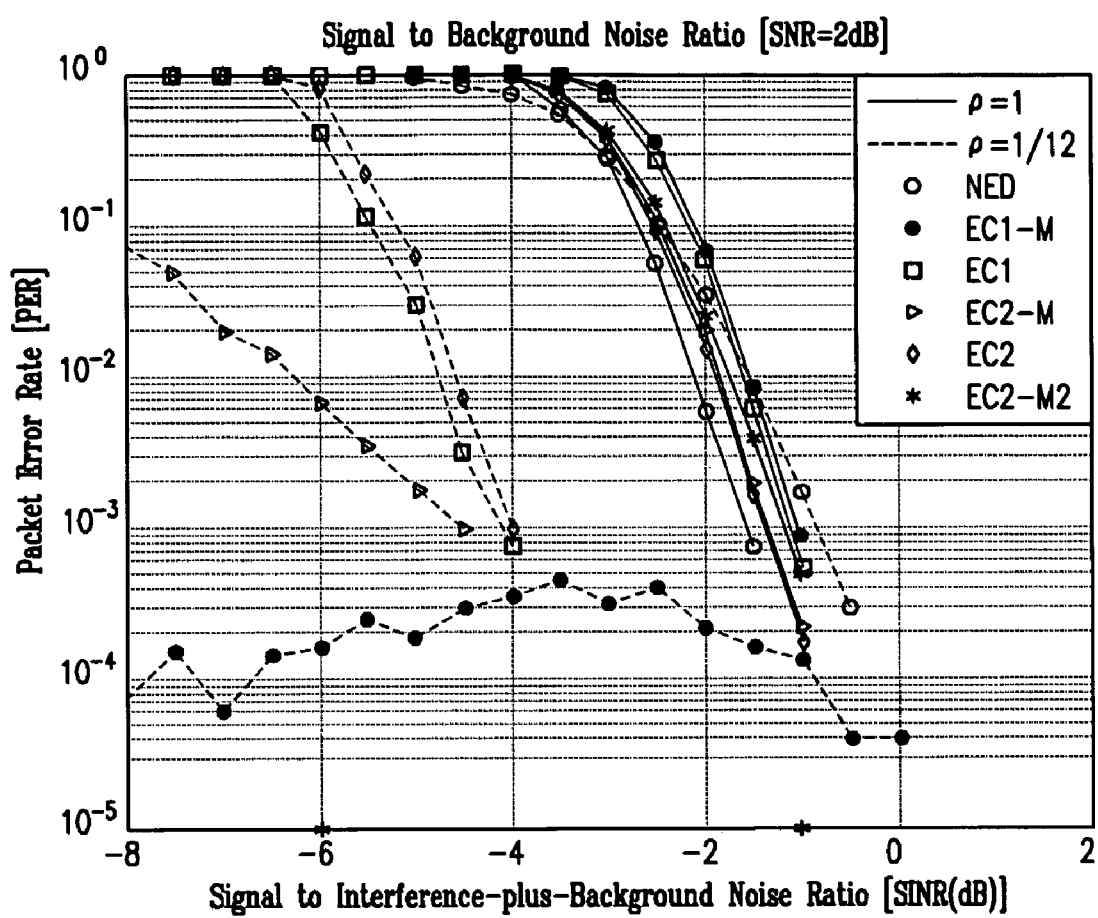
FIG. 5 shows a graph for representing a decoding performance according to a variety of erasure detection methods and status of noise variance estimation as to code blocks.

FIG. 5 shows a graph for representing a decoding performance according to a variety of erasure detection methods and status of noise variance estimation as to code blocks.

As to the code block which uses a low-density checking code and a QPSK gray mapping of which code rate is 1/6, and of which length is 1024, the decoding performance according to a signal to interference-plus-noise ratio (SINR) is described in FIG. 5 as a packet error rate (PER) according to a variety of erasure detection methods and the status of noise variance estimation.

In FIG. 5, an 'NED' is a conventional decoder using the noise variance $\sigma_{w,a}^2$ without detecting the erasure symbol, an 'EC1' is an erasure detection and soft-decision decoder using $T_i = C_i |\hat{h}_i|^2$ ($C_1 = 9$) as an erasure detection threshold value and using $\sigma_{w,a}^2$ as the noise variance of the received symbols in computing the log-likelihood ratio, and 'EC2' is an erasure detection and soft-decision decoder using $T_i = |\hat{h}_i|^2 + C_2 \sigma_{w,a}^2$ ($C_2 = 9$) as the erasure detection threshold value and using $\sigma_{w,a}^2$ as the noise variance of the received symbols in computing the log-likelihood ratio.

'EC1-M' is an erasure detection and soft-decision decoder using $T_i = C_i |\hat{h}_i|^2$ ($C_1 = 9$) as the erasure detection threshold value and using $\sigma_{w,a}^2$ as the noise variance of the received symbols in computing the log-likelihood ratio, and 'EC2-M' is an erasure detection and soft-decision decoder using $T_i = |\hat{h}_i|^2 + C_2 \sigma_{w,a}^2$ ($C_2 = 6$) as the erasure detection threshold value and using $\sigma_{w,a}^2$ as the noise variance of the received symbols in computing the log-likelihood ratio.

'EC2-M2' detects the erasure symbol twice, and $T_i = |\hat{h}_i|^2 + C_2 \sigma_{w,a}^2$ ($C_2 = 6$) is used as the threshold value for the first erasure detection and $T_i = |\hat{h}_i|^2 + C_3 \sigma_{w,u}^2$ ($C_3 = C_2 = 6$) is used as the threshold value for the second erasure detection. In the method, $\sigma_{w,u}^2$ is used for the noise variance of the received symbols in computing the log-likelihood ratio.

As shown in FIG. 5, when the erasure symbol is not detected, the performance is best when the noise power is uniform ($\rho = 1$), but the performance is decreased when the noise power is not uniform and strong interference is partially added ($\rho = 1/12$).

However, the performance of the erasure detection and soft-decision decoder according to the exemplary embodiment of the present invention is not decreased when the noise variance which the received symbol undergoes is uniform ($\rho = 1$), and performance of a cellular system is greatly improved when strong interference is partially provided ($\rho = 1/12$). Especially, the decoder by the 'EC2-M2' method properly detects signals with intensive interference, and the error rate is below 1e-5 when the SINR is over −10 dB as shown in FIG. 5.

The apparatus and the method for erasure detection and soft-decision decoding re-estimates the noise variance when the erasure symbol is once detected and detects the erasure symbol again or uses the re-estimated noise variance in computing the soft-decision decoding metrics, and therefore the received data block is reliably decoded when the interference noise power which the received symbol undergoes is not uniform, and reliable communication with users in a border of cells is also guaranteed.

Also, the present invention finds an interfered receive symbol (erasure symbol) of which interference noise variance is especially greater than the other received symbols and eliminates it, and therefore the performance of the system is improved in various noise circumstances especially when a portion of the received symbols are affected by the high power interference noise.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

The apparatus and method for the erasure detection and soft-decision decoding in a cellular system receiver according to the present invention finds a interfered receive symbol (erasure symbol) of which interference noise is especially greater than other received symbols in average and eliminates it, and therefore it is effective that the performance of the system is improved in various noise circumstances especially when some of the received symbols are effected by the high power interference noise.

Also, the present invention re-estimates the noise variance when the erasure symbol is once detected, and detects the erasure symbol again or uses the re-estimated noise variance in computing the soft-decision decoding metric, and therefore the received code block is reliably decoded when the interference noise intensity which the received symbol undergoes is not uniform, and reliable communication with users in a border of cells is also guaranteed.

What is claimed is:

1. An apparatus for erasure detection and soft-decision decoding in a cellular system receiver for decoding a code block received from a cellular system transmitter, comprising:
    a channel gain and noise variance estimator for estimating a complex channel gain and a noise variance of the received code block;
    an erasure detector for detecting an erasure symbol (a received symbol with high power interference) by comparing a threshold value based on the estimated complex channel gain or the noise variance with power of the received symbol;
    a soft-decision decoding metric calculator for setting log-likelihood ratios of constituent bits of the erasure symbols to be 0 and computing the log-likelihood ratios of the constituent bits of other received symbols; and
    a soft-decision channel decoder for decoding the received code block with the calculated log-likelihood ratios, wherein the erasure detector detects the received symbol as the erasure symbol when the power of the received symbol is greater than the threshold value,
    wherein the threshold value includes a value which is determined based on a sum of the power of the fading channel gain of the received symbol and a constant multiple of an average noise variance.

2. The apparatus of claim 1, wherein the threshold value includes a constant multiple of the power of the fading channel gain of the received symbol.

3. The apparatus of claim 1, wherein the channel gain and noise variance estimator calculates an average noise variance in a physical data channel and estimates the noise variance, and the average noise variance is given by the equation $$\sigma_{w,a}^2 = \frac{1}{L_p} \sum_{p \in \text{PILOT}} |r_p - \hat{h}_p x_p|^2$$

where $r_p$ denotes a pilot receive symbol, $x_p$ denotes a pilot transmission symbol, $\hat{h}_p$ denotes a complex channel fading gain which is estimated with a pilot channel through filtering or interpolating the tentative pilot channel estimates, and $L_p$ denotes the number of the pilot symbols in a slot.

4. The apparatus of claim 3, wherein the soft-decision decoding metric calculator uses the calculated average noise variance as the noise variance of the received symbols in computing the log-likelihood ratio.

5. The apparatus of claim 1, wherein the channel gain and noise variance estimator calculates the average noise variance in the physical data channel and estimates the noise variance, and the average noise variance is given by the equation $$\sigma_{w,a}^2 = \frac{1}{L_p} \sum_{l=0}^{L-1} |r_l - \hat{h}_l \hat{x}_l|^2$$

where $r_l$ denotes a received symbol in a physical channel to be denoted, $\hat{h}_l$ denotes a channel estimate of the $l^{th}$ data of a receive physical channel estimated by the pilot channel, $\hat{x}_l$ is given by an estimate of a transmission symbol estimated from $r_l/\hat{h}_l$, and L denotes the number of the receive symbols configuring the physical channel.

6. The apparatus of claim 1, further comprising a noise variance re-estimate unit for re-estimating the noise variance by using other received symbols which are not detected as the erasure symbol.

7. The apparatus of claim 6, wherein the soft-decision decoding metric calculator uses the re-estimated noise variance as the noise variance of the received symbols in computing the log-likelihood ratio.

8. The apparatus of claim 6, wherein the erasure detector detects the erasure symbols by comparing a new threshold value based on the re-estimated noise variance with the power of the received symbol.

9. The apparatus of claim 8, wherein the re-estimated noise variance is given by the equation $$\sigma_{w,u}^2 = \frac{1}{|U|} \sum_{l \in U} |r_l - \hat{h}_l \hat{x}_l|^2$$

in which U denotes an index set of the receive symbols which are not detected as the erasure symbol, $|U|$ denotes the total number of elements of the set of U, $r_l$ denotes the received symbol, $\hat{h}_l$ denotes the complex channel gain estimate, and $\hat{x}_l$ denotes the estimate of the transmission symbol.

10. The apparatus of claim 8, wherein the threshold value includes a value which is represented by a sum of the power of complex channel gain of the received symbol and a constant number multiple of an average noise variance.

11. The apparatus of claim 8, wherein the re-estimated noise variance is given by the equation $$\sigma_{w,u}^2 = \frac{1}{|U|} \sum_{l \in U} \left( |r_l|^2 - |\hat{h}_l|^2 \right)$$

in which U denotes an index set of the receive symbols which are not detected as the erasure symbol, $|U|$ denotes the total number of elements of the set of U, $|r_l|^2$ denotes the receive power of the received symbol, and $\hat{h}_l$ denotes the complex channel gain estimate.

12. A method for erasure detection and soft-decision decoding in a cellular system receiver for decoding a received code block from a cellular system transmitter, comprising:
   a) estimating complex channel gains and a noise variance of the received code block;
   b) detecting an erasure symbol (a received symbol with high power interference) by comparing a threshold value based on the estimated complex channel gain or the noise variance with power of the received code block;
   c) establishing log-likelihood ratios of constituent bits of the detected erasure symbols to be 0 and computing the log-likelihood ratios of the constituent bits of other received symbols; and
   d) decoding the received code block with the calculated log-likelihood ratios, wherein b) comprises detecting the received symbol as the erasure symbol when the power of the received symbol is greater than the threshold value, and the threshold value includes a value which is determined based on a sum of the power of the fading channel gain of the received symbol and a constant multiple of an average noise variance.

13. The method of claim 12, further comprising e) re-estimating the noise variance by using other received symbols which are not detected as the erasure symbol.

14. The method of claim 13, wherein b) comprises detecting the erasure symbols by comparing a new threshold value based on the re-estimated noise variance with the power of the received symbol.

15. The method of claim 14, wherein c) uses the re-estimated noise variance as the noise variance of the received symbols in computing the log-likelihood ratios.

16. The method of claim 12, wherein c) uses an average noise variance of the received symbol as the noise variance of the received symbols in computing the log-likelihood ratios.

\* \* \* \* \*